(12) United States Patent
Wink et al.

(10) Patent No.: US 6,259,903 B1
(45) Date of Patent: Jul. 10, 2001

(54) TUNER AND IF AMPLIFIER

(75) Inventors: Meye Wink, Caen; Olivier Crand, Epinay sur Odon, both of (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/407,778

(22) Filed: Sep. 28, 1999

(30) Foreign Application Priority Data

Oct. 5, 1998 (EP) .................................................. 98203343

(51) Int. Cl.⁷ ........................................................ H04B 1/18
(52) U.S. Cl. ........................ 455/193.1; 455/313; 455/341
(58) Field of Search ............................. 455/193.1, 194.2, 455/191.3, 313, 341, 333; 330/252, 301

(56) References Cited

U.S. PATENT DOCUMENTS

| | | | |
|---|---|---|---|
| 4,124,817 | * 11/1978 | Takahashi | 325/344 |
| 4,743,863 | * 5/1988 | Cassany et al. | 330/284 |
| 5,003,620 | * 3/1991 | Tenjin | 455/180 |
| 5,177,449 | * 1/1993 | Asazawa | 330/252 |
| 5,311,149 | * 5/1994 | Wagner et al. | 331/1 A |
| 5,564,098 | * 10/1996 | Rodal et al. | 455/314 |
| 5,914,638 | * 6/1999 | He | 330/258 |
| 5,930,686 | * 7/1999 | Devlin et al. | 455/84 |

FOREIGN PATENT DOCUMENTS 0866 548A1 * 9/1998 (DE) .................................. H03F/3/00

OTHER PUBLICATIONS

RF9906—1995 Designer's handbook, RF Micro Device Inc., 1995.*

* cited by examiner

Primary Examiner—Daniel Hunter
Assistant Examiner—C. Chow
(74) Attorney, Agent, or Firm—Steven R. Biren

(57) ABSTRACT

Ordinarily, at least two types of mixer oscillator integrated circuits for tuners have to be used, i.e., one for the symmetrical output mode and one for the asymmetrical output mode. In order to handle both output modes, a tuner includes a switching circuit, whereby, in the asymmetrical mode, one output of the tuner is coupled to ground.

5 Claims, 1 Drawing Sheet

TUNER AND IF AMPLIFIER

BACKGROUND OF THE INVENTION

1. Field of The Invention

The invention relates to a tuner. The invention further relates to an IF amplifier for use in such a tuner. The invention further relates to a mixer oscillator integrated circuit comprising such an IF amplifier.

2. Description of The Related Art

Such a tuner, IF amplifier, and mixer oscillator integrated circuit are known in the art, and can be used in television receivers, radio receivers, and other applications.

A disadvantage of the known tuner, IF amplifier and mixer oscillator integrated circuit, is that there has to be two kinds of tuners, IF amplifiers and mixer oscillator integrated circuits, namely, depending on the output of the tuner, a symmetrical and an asymmetrical version.

SUMMARY OF THE INVENTION

An object of the invention is to obtain a tuner, an IF amplifier and a mixer oscillator integrated circuit that can be used for both symmetrical and asymmetrical outputs. To this end a first aspect of the invention provides a tuner comprising an input circuit and a mixer oscillator stage, said mixer oscillator stage comprising an IF amplifier coupled to an output of the tuner, characterized in that the tuner further comprises switching means for switching between a symmetrical and an asymmetrical output mode, whereby, in the asymmetrical mode, one output of the tuner is coupled to a reference voltage by the switching means, and the tuner comprises control means for controlling the switching operation.

A second aspect of the invention provides an IF amplifier for use in such a tuner.

A third aspect of the invention provides a mixer oscillator integrated circuit comprising such an IF amplifier.

In this way, it is possible to use the same tuner, IF amplifier or mixer oscillator integrated circuit, respectively, for both kind of output signals, by switching the IF amplifier between the two modes, and by coupling one output of the tuner to ground in the asymmetrical mode.

In the symmetrical output mode, a signal is present on both outputs of the tuner (IF amplifier, mixer oscillator integrated circuit, respectively) to be processed further, while, in the asymmetrical output mode, an output signal is present on only one output, and the other output is coupled to ground.

In another embodiment of the invention, by using a switchable IF amplifier, the amplifier itself is switched between the two modes.

In a further embodiment of the invention, the IF amplifier comprises two amplifying means, one for the symmetrical mode and one for the asymmetrical mode, and the control means controls which amplifying means operative.

BRIEF DESCRIPTION OF THE DRAWING

The invention and additional features, which may optionally be used to advantageously implement the invention, will be apparent from and elucidated with reference to the examples described below hereinafter and shown in the drawing, in which.

DESCRIPTION OF THE PREFERRED EMBODIMENTS

Figure 1:
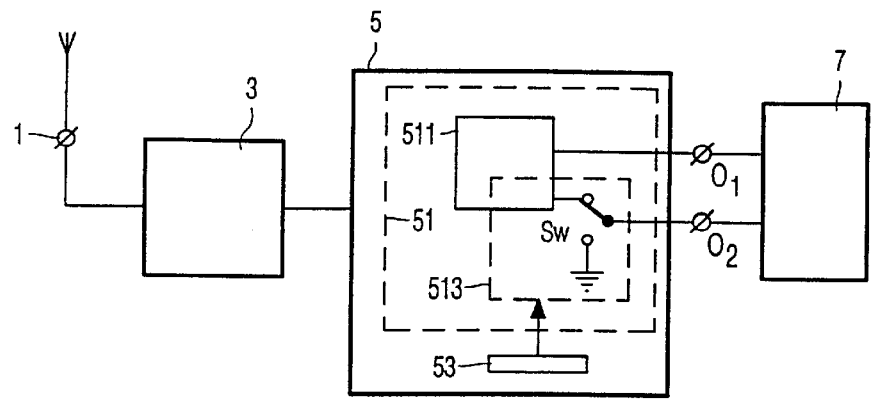
FIG. 1 is a block diagram of a tuner according to the invention.

FIG. 1 shows a block diagram of a tuner according to the invention. The tuner comprises an input 1 for receiving an input signal, for example, from an antenna, the input 1 being coupled to an input circuit 3 for processing the input signal. The input circuit 3 is coupled to a mixer oscillator stage 5 for obtaining and supplying an IF signal. The mixer oscillator stage 5 supplies the IF signal (asymmetrical or symmetrical), via outputs O1 and O2, to a surface acoustic wave (SAW) filter 7.

A general description of the operation of the tuner is not necessary as this is generally known to a person skilled in the art.

The mixer oscillator stage 5 includes, in this embodiment, a mixer oscillator integrated circuit 51. The mixer oscillator integrated circuit comprises an IF amplifier 511 and switching means 513, while the mixer oscillator stage 5 further includes control means 53 for controlling the switching means. It should be noted that the switching means can (partly) be combined with the IF amplifier (as shown in FIG. 1 by the dashed overlap between IF amplifier 511 and switching means 513).

The switching means 513 operates, under control of the control means 53, to switch the IF amplifier between the two modes, that is, the symmetrical mode and the asymmetrical mode. Further, the switching means comprise a switch SW for coupling one output (O2 in this example) to ground in the asymmetrical mode. In this way, it is possible to use the same tuner T, IF amplifier 511 or mixer oscillator integrated circuit 51, respectively, for both output signals.

In the symmetrical output mode, a signal is present on both outputs O1 and O2 of the tuner (IF amplifier, mixer oscillator integrated circuit respectively) to be processed further, while, in the asymmetrical output mode an output signal is present on only one output O1, and the other output O2 is coupled to ground.

Figure 2:
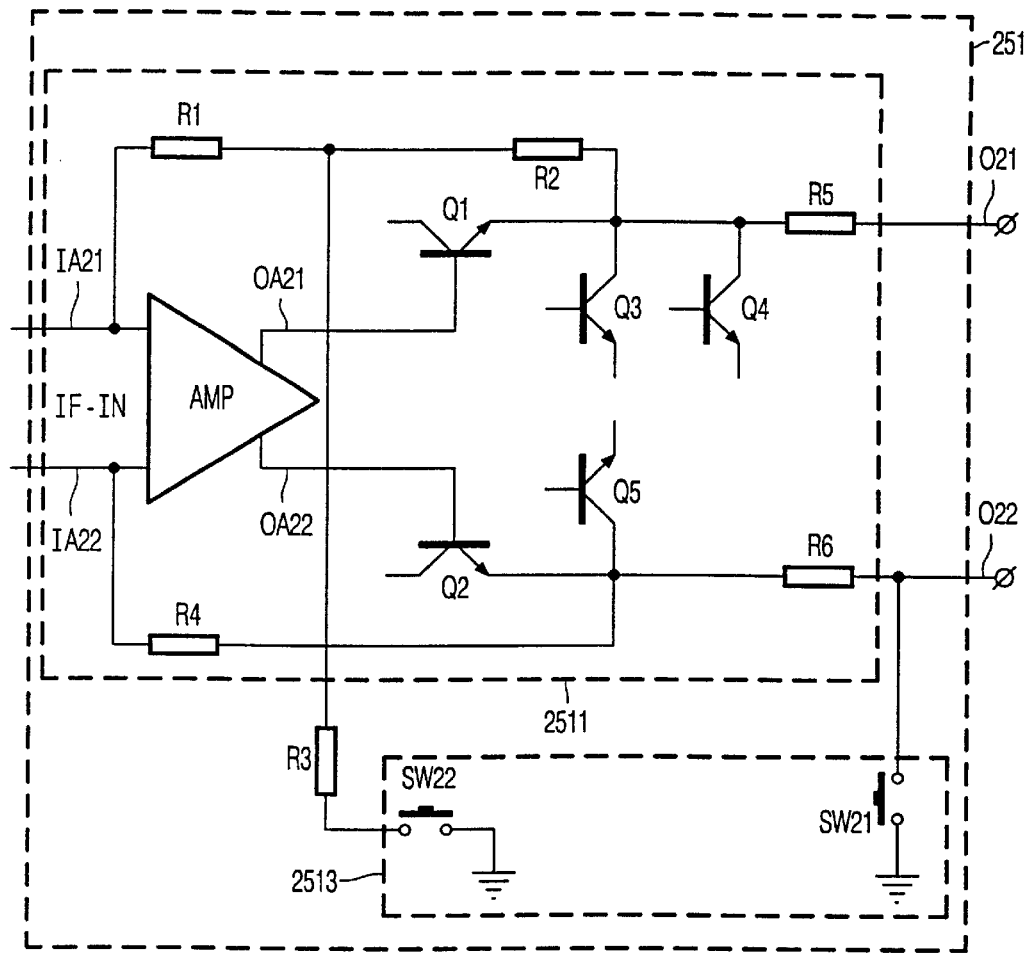
FIG. 2 is a schematic diagram of an IF amplifier for use in the tuner.

FIG. 2 shows an embodiment of part of an mixer oscillator integrated circuit 251, according to the invention, comprising the IF amplifier 2511 and the switching means 2513. The IF amplifier comprises amplifying means AMP for receiving the IF input signal(s) IF-IN at inputs IA21, IA22. Outputs OA21 and OA22 of the amplifying means AMP are coupled, via a transistor Q1 and a resistor R5, on the one hand, and via a transistor Q2 and a resistor R6, on the other hand, to outputs 021 and 022. The transistors Q1 and Q2 are both emitter followers at the output.

Feedback resistors R1, R2, R3 and R4 determine the gain of the IF amplifier 2511, whereby, in this embodiment, the sum of the values of resistors R1 and R2 corresponds with the value of resistor R4.

In the symmetrical mode, switch SW22 of the switching means 2513 is open. In the asymmetrical mode the switch SW22 is closed and the gain is increased in the upper branch, including the resistors R1 and R2. In this way, it is possible to obtain a substantial equal overall gain in both the asymmetrical and the symmetrical mode.

The DC current for the output emitter followers is set by current sources which, in this embodiment, are implemented by transistors Q3, Q4 and Q5.

In the symmetrical mode, Q3 and Q5 provide equal DC currents for Q1 and Q2, while Q4 is cut off.

In the asymmetrical mode, Q5 is switched off, and Q4 is switched on, doubling the DC current of Q1, compared to the symmetrical mode. This doubling is necessary, as is well known to the person skilled in the art, if a minimal dissipation is required. In the symmetrical mode, both outputs contain information, and the DC current is approximately one-half the value required when the whole voltage swing is present at only output in the asymmetrical mode.

Instead of one amplifying means as described above, the invention can also be implemented with two amplifying means, one for the symmetrical mode and one for the asymmetrical mode. Also, in this case, one output (O22 in FIG. 2) is coupled by switching means to ground in the asymmetrical mode.

The person skilled in the art will be well aware of many variations of the above-described embodiments using the same idea of invention.

For example, it is possible, not necessary, to incorporate the control means within the mixer oscillator integrated circuit.

FIG. 2 shows a very detailed embodiment of part of the mixer oscillator integrated circuit, which, of course, is not the only way to implement the IF amplifier for this invention. Further, the switching means may be arranged totally inside the mixer oscillator integrated circuit, partly inside the mixer oscillator integrated circuit, partly outside the mixer oscillator integrated circuit, or even totally outside the integrated circuit.

Ground may be any suitable reference voltage.

What is claimed is:

1. A tuner comprising an input circuit and a mixer oscillator stage, said mixer oscillator stage comprising an IF amplifier coupled to an output of the tuner, characterized in that the tuner further comprises:

switching means for switching between a symmetrical output mode and an asymmetrical output mode, using a same output node of said IF amplifier in both modes, whereby in the asymmetrical mode, said switching means conductively couples one output of the tuner to a reference voltage; and control means for controlling the switching means.

2. The tuner as claimed in claim 1, characterized in that the IF amplifier is a switchable IF amplifier.

3. The tuner as claimed in claim 1, characterized in that the IF amplifier comprises a first amplifying means and a second amplifying means, whereby the first amplifying means operates in the symmetrical output mode and the second amplifying means operates in the asymmetrical mode.

4. An IF amplifier for use in a tuner according to claim 3.

5. A mixer oscillator integrated circuit comprising an IF amplifier according to claim 3.

* * * * *